(12) United States Patent
Zhang et al.

(10) Patent No.: US 9,748,951 B2
(45) Date of Patent: Aug. 29, 2017

(54) SWITCHING CIRCUIT

(71) Applicant: IMEC VZW, Leuven (BE)

(72) Inventors: Xiaoqiang Zhang, Leuven (BE); Mark Ingels, Boutersem (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/195,707

(22) Filed: Jun. 28, 2016

(65) Prior Publication Data

US 2017/0005654 A1 Jan. 5, 2017

(30) Foreign Application Priority Data

Jun. 30, 2015 (EP) .................................... 15174613

(51) Int. Cl.
*H04L 27/12* (2006.01)
*H03K 17/687* (2006.01)
(Continued)

(52) U.S. Cl.
CPC ........... *H03K 17/687* (2013.01); *H03F 1/086* (2013.01); *H03F 1/14* (2013.01); *H03F 1/3205* (2013.01); *H03F 3/193* (2013.01); *H03F 3/211* (2013.01); *H03F 3/2171* (2013.01); *H03F 3/2178* (2013.01); *H03F 3/245* (2013.01); *H03M 1/66* (2013.01); *H04L 27/20* (2013.01); *H03F 2200/231* (2013.01); *H03F 2200/324* (2013.01); *H03F 2200/336* (2013.01); *H03F 2200/451* (2013.01); *H03F 2200/519* (2013.01); *H03F 2200/525* (2013.01); *H03F 2200/61* (2013.01);
(Continued)

(58) Field of Classification Search
CPC . H04L 27/0008; H04L 27/2017; H04L 27/04; H03C 3/40

USPC .......... 375/302, 300; 341/120, 153; 330/253
See application file for complete search history.

(56) References Cited

U.S. PATENT DOCUMENTS 5,471,172 A * 11/1995 Chiu ....................... H03F 1/523
                                                          330/253
9,357,607 B2 * 5/2016 Kahlman ........... H05B 33/0815
(Continued)

OTHER PUBLICATIONS

Ingels, Mark et al. "A linear 28nm CMOS digital transmitter with 2 × 12bit up to LO baseband sampling and -58dBc C-IM3" Eur. Solid State Circuits Conference (ESSCIRC), ESSCIRC 2014, pp. 379-382.

*Primary Examiner* — Khai Tran
(74) *Attorney, Agent, or Firm* — Knobbe Martens Olson & Bear LLP (57) ABSTRACT

A conversion circuit is disclosed. In one aspect, the conversion circuit includes a first input terminal for receiving a digital signal. The conversion circuit includes a second input terminal for receiving a bias voltage signal. The conversion circuit includes an output terminal for outputting a current. The conversion circuit includes a first and a second switch transistor connected to the first input terminal for receiving the digital signal. The conversion circuit includes a first and a second current source transistor connected to the second input terminal for receiving the bias voltage signal. The conversion circuit further includes a first branch, wherein the first switch transistor is connected to the output terminal via the first current source transistor. The conversion circuit further includes a second branch, wherein the second current source transistor is connected to the output terminal via the second switch transistor.

19 Claims, 6 Drawing Sheets

(51) Int. Cl.
    *H03F 1/08*         (2006.01)
    *H03F 1/14*         (2006.01)
    *H03F 1/32*         (2006.01)
    *H03F 3/193*       (2006.01)
    *H03F 3/21*         (2006.01)
    *H03F 3/217*       (2006.01)
    *H03F 3/24*         (2006.01)
    *H03M 1/66*        (2006.01)
    *H04L 27/20*       (2006.01)
    *H03K 17/16*       (2006.01)
    *H03K 17/62*       (2006.01)
    *H03M 1/08*        (2006.01)
    *H03M 1/74*        (2006.01)

(52) U.S. Cl.
    CPC ........ *H03F 2200/75* (2013.01); *H03K 17/161* (2013.01); *H03K 17/164* (2013.01); *H03K 17/6292* (2013.01); *H03M 1/0863* (2013.01); *H03M 1/742* (2013.01)

(56) References Cited

U.S. PATENT DOCUMENTS

| | | | |
|---|---|---|---|
| 2005/0035892 A1* | 2/2005 | Devendorf | H03M 1/0643 341/153 |
| 2010/0244796 A1* | 9/2010 | Chen | H02M 3/156 323/282 |
| 2010/0254490 A1 | 10/2010 | Moreira | |
| 2012/0007757 A1* | 1/2012 | Choe | H03M 1/1061 341/120 |
| 2015/0035611 A1* | 2/2015 | Swaminathan | H03B 5/24 331/113 R |

* cited by examiner

SWITCHING CIRCUIT

RELATED APPLICATIONS

This application claims priority to European Application EP 15174613.8, entitled "SWITCHING CIRCUIT," filed on Jun. 30, 2015, and incorporated herein by reference in its entirety.

BACKGROUND

Field

The disclosed technology relates to the field of switching circuits impacted by charge injection, as encountered in digital transmitters, high speed digital to analog converters (DACs) and the like.

Description of the Related Technology

Nanoscale CMOS has brought many high speed applications to the consumer thanks to the computing power that can be squeezed into modern signal processors. Unfortunately, the intrinsic analog properties of CMOS transistors do not follow the improvements of their digital counterparts. CMOS transistor parameters including output impedance, supply versus threshold ratio and intrinsic gain typically worsen with the advance of the CMOS technological nodes.

One example of an important application field relates to digital radio transmitters. Modern communication schemes impose tough requirements on radio transmitters. Transmitters operating at RF have to combine hard requirements such as RF bandwidth, linearity and out-of-band noise while maintaining high efficiency. As a result, porting an analog RF transmitter from one technological node to another is complicated and therefore slow and costly. Therefore, transmitters need to have the least possible analog circuitry. In addition, it is desirable for radio transmitters to be easily scalable with the advancement of CMOS technologies.

To address the problem of analog RF transmitters, a new family of RF transmitters, digital transmitters (also referred to as RF-DACs or Direct Digital RF Modulators, DDRM), has been adopted. The digital transmitters feature predominantly digital circuitry which is better suited for advanced CMOS technology and which scales much better with various CMOS technological nodes. In contrast to their analog counterpart, the performance of digital transmitters intrinsically improves with the scaling of CMOS technology.

The first digital transmitters were based on a polar architecture, in which a phase modulated local oscillator (LO) signal is fed to a multitude of DDRM units and amplitude modulation is performed by enabling or disabling (switching on or off) these DDRM unit amplifiers and then combining their output power to form a modulated RF analog signal. Later, Cartesian DDRM architectures consisting of two such digital amplitude modulators, for modulating the in-phase (I) and the quadrature (Q) signals with the respective LO phasess. The outputs of these two digital amplitude modulators are summed before being fed to the antenna for transmission.

An RF DAC is created by summing the outputs of a multitude of switched current sources. In a traditional high speed DAC a differential operation is typically applied and the current of the unit current source is switched to either the positive or the negative side in order to keep the current in the current source constant. To achieve a low instantaneous amplitude during modulation at the RFDAC output a number of unit cells (current sources) are effectively turned off in order to avoid power waste and to keep a high efficiency of the transmitter.

In the paper "*A linear 28 nm CMOS digital transmitter with 2×12 bit up to LO baseband sampling and—58 dBc C-IM3*" (M. Ingels et al., Eur. Solid State Circuits Conference (ESSCIRC), ESSCIRC 2014, pp. 379-382) a current source based DDRM is disclosed in which a very high output impedance is targeted, even at maximal code and high output power. Each unit DDRM cell includes a current source transistor, which allows achieving operation with linear response. The output current of the DDRM is given by the number of active units cells multiplied by the unit current of the active cells.

Figure 1:
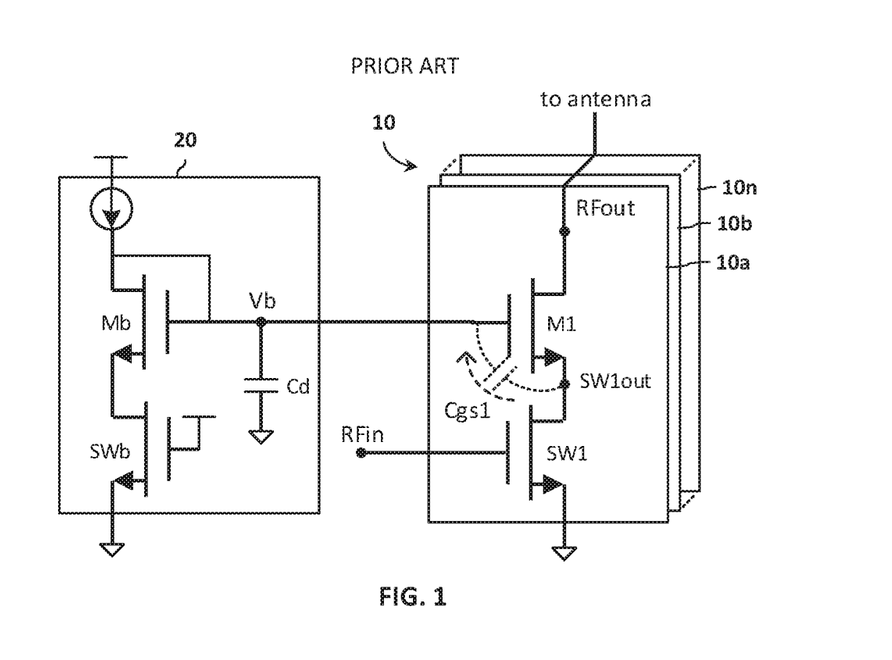
FIG. 1 illustrates a conventional implementation of a unit cell for a digital amplitude modulator including a plurality of such cells.

FIG. 1 illustrates an implementation of a unit cell. Switch transistor SW1 is connected in series to transistor M1, which determines and delivers the current provided by the cell. M1 is biased by the voltage Vb at its gate and acts as a current source. The current provided by this current cell can be turned off by the MOS transistor SW1, which acts as a switch, and which has a digital signal at its input. This signal will typically occur at a very high speed. In the paper this switching occurs at an (intermittent) LO speed. Switching on or off SW1 enables or disables the conversion cell. When SW1 is enabled, the current source transistor M1 generates an analog signal at the output of the cell. In other words, the switch transistor SW1 determines whether a current is flowing through the current source transistor M1.

The value of that current is mainly determined by the bias voltage Vb applied at the gate terminal of M1 and the dimensions of transistor M1. By adjusting the bias voltage Vb, the value of the current flowing, i.e., the analog signal amplitude, can be adjusted. Consequently, digital modulation is achieved by turning on more or less of the cells. Vb controls the level of the digitally modulated signal. It can be seen as controlling the digital transmitter gain. The switch transistor resistance results in some extra power dissipation when a current is flowing through the activated unit cell. Its resistance value should thus be chosen low enough to limit this dissipation. As the bias voltage of transistor M1 and its dimensions determine the current of the active unit cells, it determines the transmitter output power. While the current in the given unit cell is constant when the cell is in operation (and thus contributing to the modulation), the current may be adjusted to control the RMS output power of the transmitter and thus its gain.

Switching activity of the switch SW1 in an RF-DAC unit positioned as in FIG. 1 causes the source voltage of the current source transistor M1 to vary rapidly and inject charge into the bias node of the current source through the transistor's gate-source capacitance. This affects the bias voltage of the current source in the unit and the current provided by the current source. As a result, the current provided by the current source transistor is no longer the ideal nominal value and the sum of the currents of all the active unit cells is not the correct expected value.

Figure 2:
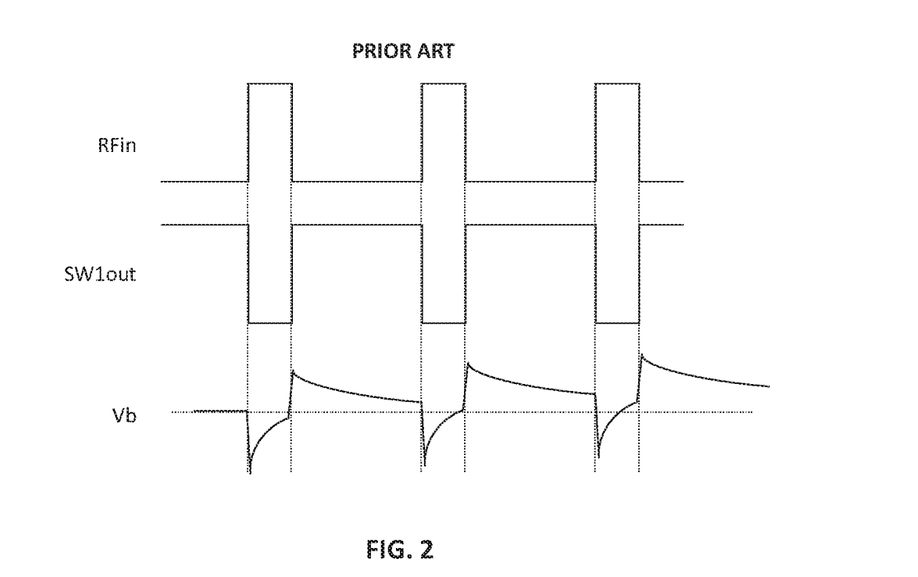
FIG. 2 illustrates a voltage swing generating glitches on current source bias.

When the bias voltage is disturbed by charge injection, it starts settling back to its nominal value right after the disturbance, but it does not reach its nominal value within one switching cycle (see FIG. 2). This voltage settling on the bias node is determined by the time constant of that bias node, which is typically much longer than the switching speed of the unit cells. The time constant of the bias node is defined by the output impedance at the bias node and the decoupling capacitor Cd, which in turn form a low-pass filter. Indeed, the time constant of the current cell is typically in the frequency range of the baseband signal (MHz range).

The time constant is determined by the output impedance of the bias circuit, which may be a simple diode or a more elaborate circuit, and the decoupling capacitor, while the switching speed of the units typically occurs at the rhythm of the output RF frequency (GHz range).

When a second charge injection occurs at the next switching event, the bias voltage is still settling and further deviates from its nominal value, as it already deviated from the first occurrence and was not yet able yet to regain its nominal state. If unit cells are continuously active, the bias voltage eventually settles to a certain equilibrium point (as the drive towards the nominal value gets stronger as the bias voltage deviates more). However, in a DDRM the activity of the various units depends on the baseband data and activity periods alternate with periods of inactivity. Therefore, periods of switching activity alternate with cycles without switching activity. As a result, the current provided by a unit cell after a long inactivity is different from the unit cell current provided after a period of more intense switching activity (in the first case it is closer to the nominal value, in the second case it is further off).

As the switching activity in a DDRM depends on the baseband data, the current provided by the unit cells depends on the 'history' of the baseband data. This is a memory effect. The current of the unit cells depends on the data applied to the cell before. This results in distortion of the output signal of the DDRM and is difficult to predistort. In a DDRM it is even tougher as the bias voltage is typically shared between many or all the DDRM units. As a result, the bias voltage for a given unit is affected by the activity in other cells, which makes the effect and the eventual predistortion even tougher. Furthermore, the partitioning of the units into binary and thermometer coded groups of units add even more to the distortion (as there is no simple relation with for example the signal amplitude and the amount of charge injection).

Figure 3:
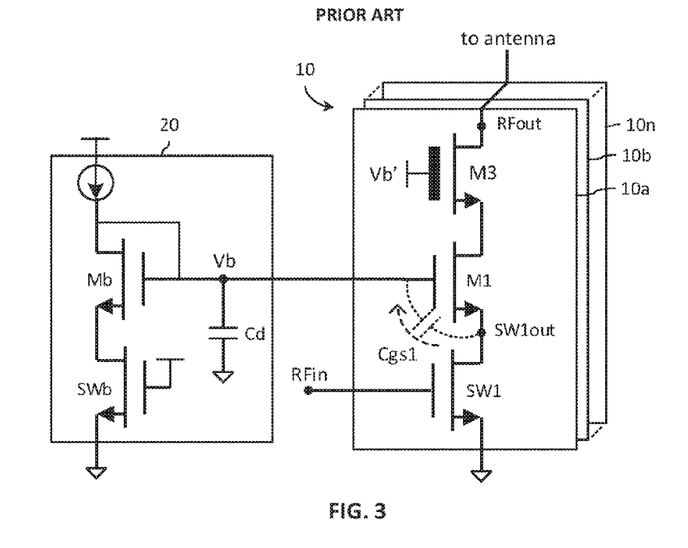
FIG. 3 illustrates an implementation of a unit cell with a cascode transistor.

In order to avoid the need for predistortion, it is essential to keep the output impedance variation small relative to the load impedance. Therefore, the unit cell further includes an additional transistor M3 in cascode to the current source transistor M1, as illustrated in FIG. 3. As the output impedance of the DDRM can be considered in parallel with the load to the DDRM, the actual load seen by the DDRM is a parallel circuit of the effective load and its own output impedance. The higher this output impedance, the lower its contribution, and the lower the impact of variations (due to the modulation) of this output impedance. Consequently, the increased output impedance further improves the linear operation of the DDRM so that pre-distortion is not (or at least much less) needed. In an RF DAC the transistor M2 in cascode is typically a thick oxide device which protects the fast thin oxide core from a large output swing.

In the implementations shown in FIG. 1 and FIG. 3, the switch SW1 is placed below (i.e. the drain terminal of the switch is connected to the source terminal of the current source transistor) the current source in order to maximize the overdrive voltage of the switch when it is turned on and so to reduce its on-resistance. As the unit amplifier is turned on and off, the voltage at the source terminal of the current source moves up and down at the rhythm of the switching, with a voltage swing which is close to the overdrive voltage of the current source transistor M1. As the source terminal and the gate of the current source transistor M1 are coupled through its gate-source capacitance, a charge is injected from the source node to the gate node at each edge of the swinging voltage. This creates a voltage spike at the gate of the current source transistor M1, whose amplitude depends on the size of the gate-source capacitance, on the decoupling capacitor used to decouple the gate node and on the source impedance of the circuit providing the bias voltage to the current source. The latter circuit can be as simple as a diode connected transistor followed by a low-pass filter, but it may be more complex. The low-pass filter may consist of a single decoupling cap together with the non-zero output impedance of the (diode) source and is typically provided to stabilize the bias voltage of the current source. After each voltage spike, the bias voltage tends to evolve towards the nominal value, with a settling time determined by the time constant of the low-pass filter.

Unfortunately, as the rising and falling edges at the source terminal of the current source transistor are not equal and as the settling of the bias node is typically much slower than the switching frequency of the switch, the amounts of charge injected onto and extracted from the decoupling capacitance within one switching sequence are not equal and some residual charge will persist. This residual charge is compensated by the bias source, but due to its limited bandwidth, it may not occur within one switching clock cycle (see FIG. 2). As a result, when the unit amplifier is switched on a second time, the residual charge, which is still present, causes a slight difference in the bias voltage of the current source and the current at the output will be slightly different. This eventually results in distortion at the RF-DAC output. Moreover, as the residual charge is built up from the subsequent active cycles and as the recovery takes multiple switching cycles, the resulting distortion in a given unit amplifier is dependent on the past activity of this unit amplifier. In other words, there are memory effects in the distortion. The resulting distortion is even more significant when a common bias and/or decoupling is used for multiple unit amplifiers, as the charge injection of one amplifier disturbs the other amplifiers. This is typically the case in a DDRM. However, as predistortion algorithms having to deal with memory effects are complex and limited in effectivity, especially when there is interaction between the various units. this effect should be avoided in the design already.

US PG Publication No. US2010/0254490 discloses various implementations of a mixer for a high gain range transmitter. A differential circuit is proposed to implement the mixer. Due to the switching activity, charge is injected through the gate-drain capacitances of the transistors at the local oscillator inputs. In order to compensate for this charge injection additional cross-coupled transistors are provided acting as capacitances. In this way the charge injection from the gate-drain capacitance of a first switching transistor receiving one LO phase can be cancelled through the gate capacitance of the extra cross-coupled transistor used as a capacitor and receiving the opposite LO phase signal and vice versa. In this way the direct charge injection into the signal path due to the switching activity in the LO signal is cancelled.

Hence, there is a need for modifying the RF DAC unit cell so that charge injection is reduced and thus any need for providing complex predistortion is avoided.

SUMMARY OF CERTAIN INVENTIVE ASPECTS

One objective of the disclosed technology is an RF DAC unit cell capable of limiting or eliminating the need for predistortion.

One aspect the disclosed technology is a conversion circuit. The conversion circuit includes a first input terminal for receiving a digital signal. The conversion circuit further includes a second input terminal for receiving a bias voltage signal. The conversion circuit further includes an output terminal for outputting a current. The conversion circuit further includes a first and a second switch transistor connected to said first input terminal for receiving said digital signal. The conversion circuit further includes a first and a second current source transistor connected to said second input terminal for receiving said bias voltage signal. The conversion circuit further includes a first branch. The first switch transistor is connected to the output terminal via the first current source transistor. The conversion circuit includes a second branch. The second current source transistor is connected to the output terminal via the second switch transistor.

The disclosed technology avoids complex predistortion as the switching circuit for a unit cell now contains two branches so conceived that charge injection into the bias of the first branch is compensated by an inverse charge injection in the second branch.

In an embodiment the conversion circuit further includes a transistor in cascode arranged for being fed with the current output via said output terminal.

In one embodiment the output terminal is implemented as two separate terminals, one in each branch.

In another embodiment the digital signal is a modulated local oscillator signal.

In an embodiment the gate-source capacitance of the first current source transistor is substantially equal to the gate-drain capacitance of the second current source transistor. In an embodiment, the ratio of the sizes of the first and the second current source transistor is about 1 to 3.

In another embodiment the circuit is also arranged for adding a bleeder current.

In another aspect the disclosure relates to a device including a conversion circuit as previously described.

In an embodiment the device includes a plurality of said conversion circuits arranged in parallel.

In one embodiment the device includes a bias circuit arranged for generating the bias voltage signal, whereby the bias circuit includes a decoupling capacitance at its output.

In another embodiment the digital signal is a phase modulated RF signal so that the device can act as a polar digital transmitter.

Another aspect the disclosure is a system including a first and a second device as described above, adapted to modulate an in-phase and a quadrature signal, respectively, so that the device can act as a Cartesian RF digital-to-analog converter.

For purposes of summarizing the disclosure and the advantages achieved over the prior art, certain objectives and advantages of the disclosure have been described herein above. Of course, it is to be understood that not necessarily all such objectives or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objectives or advantages as may be taught or suggested herein.

The above and other aspects of the disclosure will be apparent from and elucidated with reference to the embodiment(s) described hereinafter.

BRIEF DESCRIPTION OF THE DRAWINGS

The disclosure will now be described further, by way of example, with reference to the accompanying drawings, wherein like reference numerals refer to like elements in the various figures.

DETAILED DESCRIPTION OF CERTAIN EMBODIMENTS

The disclosed technology will be described with respect to particular embodiments and with reference to certain drawings but the disclosure is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects of the disclosure should not be taken to imply that the terminology is being re-defined herein to be restricted to include any specific characteristics of the features or aspects of the disclosure with which that terminology is associated.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

In the disclosed technology it is proposed to split the single branched traditional unit cell into two branches, which inject charges of opposite sign into the bias node and which are dimensioned (weighed) in such a way that the injected inverse charges effectively neutralize each other. In an embodiment, this occurs at an optimal ratio of the two branches.

By placing (see FIG. 4) the switch transistor SW2 on top of the current source transistor M2 (i.e. the source terminal of the switch is connected to the drain terminal of the current source transistor), the function of the unit 10 remains the same: it is a current which can be turned on or off by adding a switch in series with the current source, but the voltage at the source terminal of the current source transistor now remains constant. However, now the activity occurs on the drain node of the current source transistor M2. As the drain-gate capacitance is typically smaller than the source-gate capacitance of the same transistor, the charge injection due to this activity is smaller. It is not zero though and a big decoupling capacitor is still needed to keep the bias voltage stable, while memory effects are still present.

Figure 4:
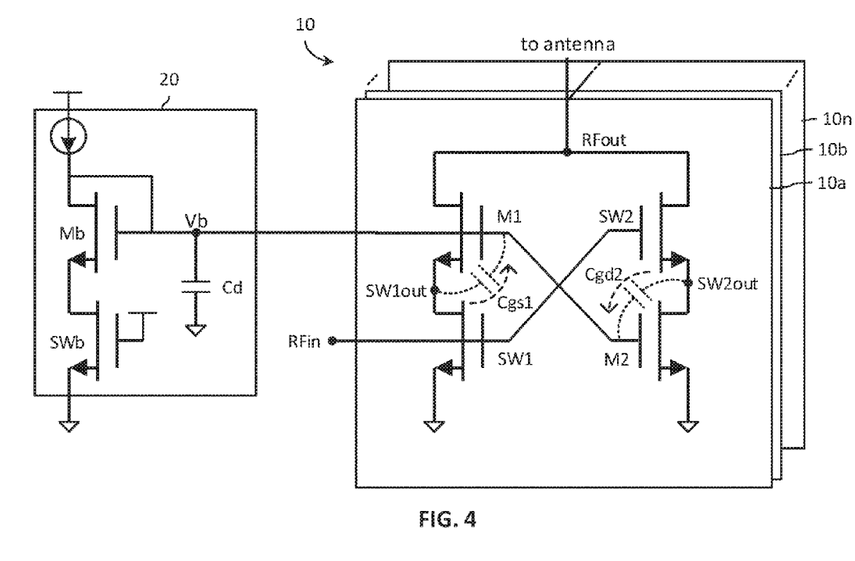
FIG. 4 illustrates an embodiment of the circuit according to the disclosed technology.

The charge injected from the switching at the drain terminal has the opposite sign of the charge injected from switching at the source terminal of the active transistor. It is this observation that has led to the disclosed technology. As this is a serious problem for the DDRM linearity, it is aimed to reduce the charge injected into the bias node by any given unit in the DDRM. Switching activity is inherent to a DDRM and cannot be avoided. This disclosure reduces the net charge injected into the bias node during the switching activity of the unit by injecting a negative charge into the bias node to compensate for any positive charge injection (and vice versa). This is performed in a clever way by splitting the unit into two sub-units (or two switching branches), which essentially have the same total dimensions, while no extra digital signals (LO or modulated LO) have to be created or provided, thus creating no overhead in area or power consumption.

In the proposed solution the unit cell 10 is divided into two weighted smaller sub-units, such that the sum of the sizes of both sub-units correspond to the original unit size. The first sub-unit (in branch 1) is designed in a configuration of a switch transistor SW1 connected to the source terminal of a current source transistor M1, while the other sub-unit in branch 2 has a switch SW2 connected at the drain terminal of the current source transistor M2. The outputs of both sub-units are combined at node RFout, as shown in FIG. 4. Both sub-units are in first order functionally the same: they include a current source transistor (M1, M2) in series with a switch (SW1, SW2). Their output currents are combined at the outputs of the branches, which allows achieving the same function as the original cell as presented in FIG. 1. However, as discussed above, when the unit cell is turned on or off, the voltages inside the sub-units, i.e. the voltages at nodes SW1out and SW2out, vary in a different way. In branch 1, with the current source below, the source terminal of the current source transistor M1 sees a relatively large voltage swing at its terminal, while in the second branch the voltage swing is present at the drain terminal of the current source transistor M2. Both swings (SW1out, SW2out) have an opposite sign. Hence, the charge injected into the (common) bias node through the Cgs1 of the first sub-unit and the Cgd2 of the second sub-unit has opposite sign as do the voltage swings at the corresponding nodes SW1out and SW2out.

By sizing the ratio of both sub-units correctly, the charge injected by one sub-unit is compensated by the charge injected by the other sub-unit. This ratio is mainly dominated by the ratio between Cgs1 and Cgd2.

Figure 6:
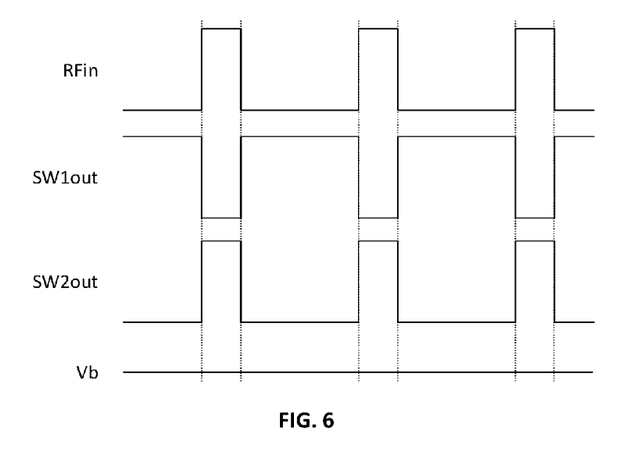
FIG. 6 illustrates various voltage swings in the circuit and the resulting stable bias voltage.

The gate-source capacitance Cgs of a MOS transistor is typically larger by a factor of approximately 3 compared to the gate-drain capacitance Cgd of the same transistor. This ratio mainly determines the ratio of the sub-units. If the swing at the source terminal of the current source transistor M1 of the first sub-unit (SW1out) is different from the swing at the drain terminal of the current source transistor M2 of the second sub-unit (SW2out), this also has an impact on the sizing of the sub-units in such a way that a bigger swing requires a smaller capacitor to the gate for a certain charge injection into the bias node. When the sub-units are ideally weighted, opposite charges are injected through the respective Cgs1 and Cgd2 of both sub-units into the bias node, at the same instant in time, resulting in a net zero charge injection. As a result the bias voltage Vb stays constant and the current in the current sources as well (as shown in FIG. 6). Furthermore, as the bias voltage does not have to settle back to its nominal value, which typically occurs at a relatively slow time constant of the bias source-decoupling capacitor combination, memory effects caused by bias voltage variations due to past activity of the units are avoided.

Figure 5:
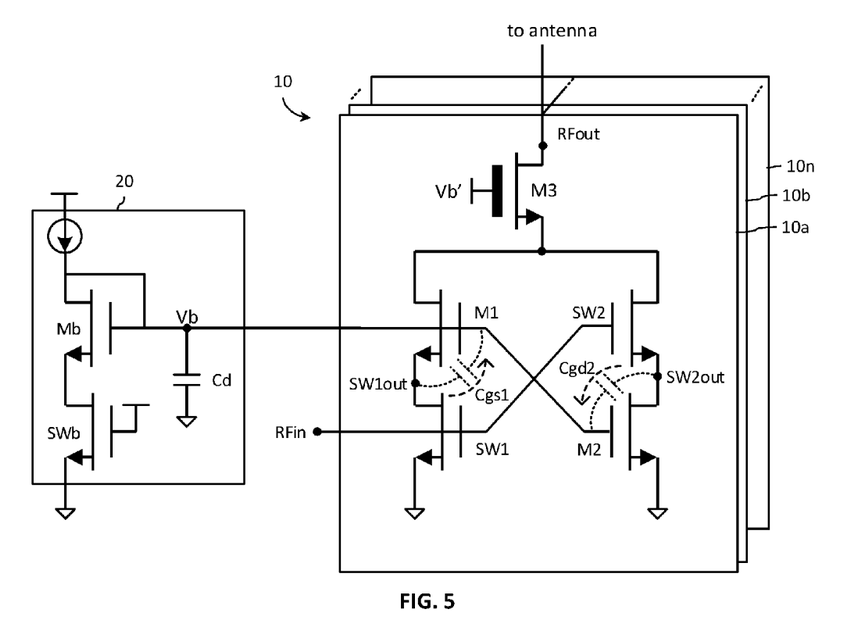
FIG. 5 illustrates an embodiment of the circuit according to the disclosed technology including a cascode transistor.

In another embodiment a transistor M3 in cascode to the drain terminal of M1 and the source terminal of SW2 may be provided, wherein the cascode transistor receives the output current of the two sub-units. Herein, the output current, RFout, of the unit cell is now at the drain terminal of the cascode transistor. FIG. 5 provides an illustration. The output impedance of the digital transmitter is in parallel with its load. As already discussed above, the higher this output impedance, the lower its contribution. In this way the output impedance variation is kept small relative to the load impedance. The cascode transistor also protects the proposed circuit 10, which is typically realised in high speed but low voltage CMOS, from the high voltage swings at the output of the transmitter.

The skilled person will readily understand that it is not essential to have a single output terminal RFout. The output terminal may in certain embodiments of the disclosure be implemented as two separate terminals, one in each branch.

In a typical use case, for example in polar-based transmitters, the digital signal is a modulated local oscillator signal.

A digital radio transmitter normally contains a multitude of conversion circuits 10 connected in parallel as described above. Usually the digital radio transmitter also includes a bias circuit 20 to generate the bias voltage signal. The bias circuit includes a decoupling capacitance Cd at its output. The bias circuit is connected with one or more of the unit cells. Various options can be envisaged. In one embodiment each unit cell is provided with a bias circuit. Alternatively, some of the unit cells or all of them can be connected to a separate bias circuit.

Figure 7:
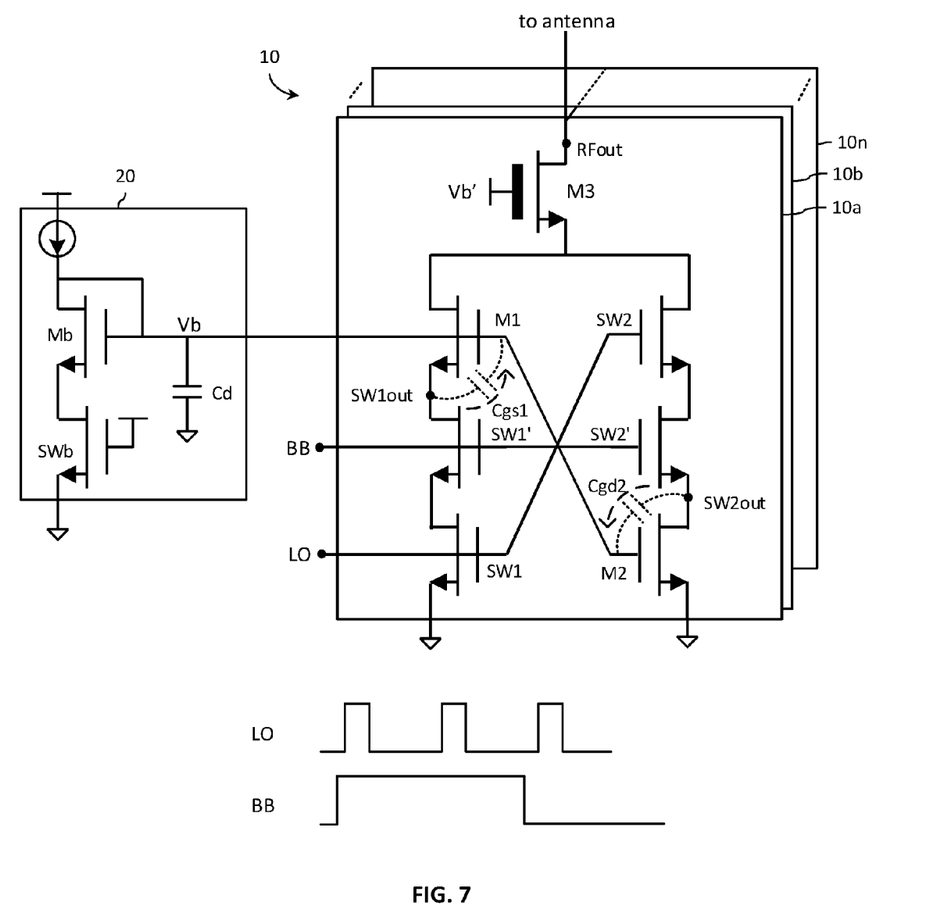
FIG. 7 illustrates an embodiment of the circuit according to the disclosed technology.
Figure 8:
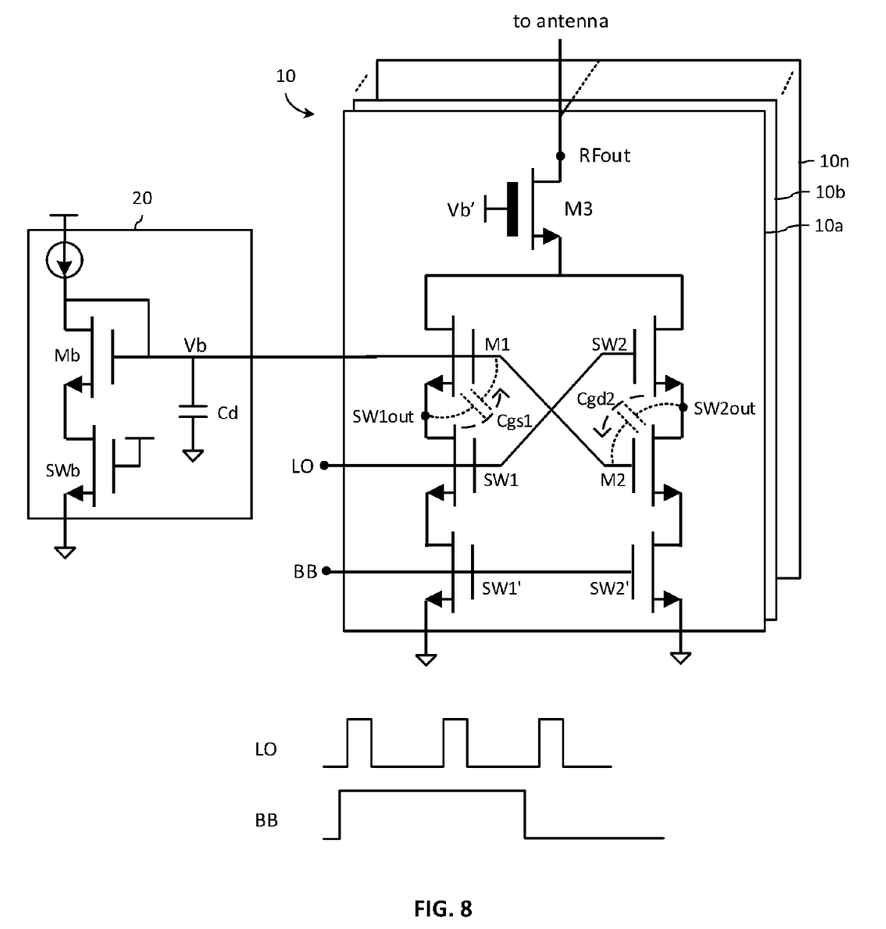
FIG. 8 illustrates an embodiment of the circuit according to the disclosed technology.

Some alternative unit cell implementations are shown in the remaining figures. In FIG. 7 an extra switch in each branch, i.e. SW1' and SW2' respectively, is added in the signal path (i.e. in between the switch transistor SW1,SW2 and the current source transistors M1,M2) which may be activated by a digital baseband signal BB. In FIG. 8 an extra switch in each branch is added as well, but at a different position, i.e. below the switch transistor SW1, SW2. These architectures may for example be used when the LO signal is not yet modulated by the digital baseband signal BB so that the actual modulation occurs inside the unit cell by AND-ing the BB and LO signals using switches SW1 and SW1' and switches SW2 and SW2', respectively. Note that in the figures the BB signal time scale can be different from the LO's time scale. Such implementations may be used in quadrature-based transmitters, wherein a first digital signal is a non-modulated local oscillator signal and a second digital signal is a digital BB signal.

Figure 9:
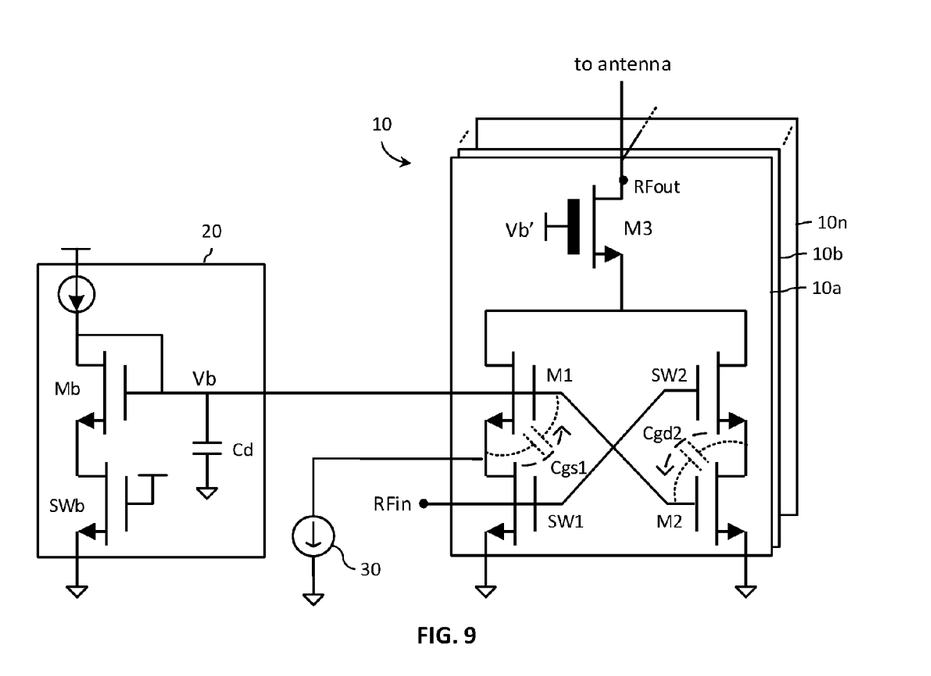
FIG. 9 illustrates an embodiment of the circuit according to the disclosed technology wherein a bleeder current is added.

Other improvements can be implemented into the unit cell 10 that are also compatible with the idea. For example, in FIG. 9 a unit cell is shown, wherein a bleeder current source 30 adds a bleeder current in the signal path branch 1 to keep a small amount of current through the current source M1 and through the cascode M3, if present. The bleeder current source 30 may be implemented as a transistor operating as a current source. The bleeder current increases the settling speed at the source terminals of M1 and, if present, M3 and improves the unit cell performance further. Indeed, even when the bias voltage Vb has been stabilized by nulling the net charge injection, the settling of the internal circuit nodes, i.e. SW1out and SW2out, may still result in memory effects and distortion if this settling is slower than the period of the high frequency signal (i.e. RFin or LO) controlling the switching of SW1 and SW2, for the same reason as discussed with the bias settling. If the settling is not complete before the next switching, the start position of the second switching is different from the first and the behaviour of the cell is slightly different in the second switching than in the first. So, following the same reasoning as before, this results in distortion and memory effects. Keeping the unit cell 10 on with a small current speeds up the internal nodes. Note that in the FIG. 9 the bleeder 30 is placed in the first branch and does only pull current through M1 and the cascode M3 (if present) in the off-state of the unit. The second branch does not yield bleeding when turned off. This is done to save some current as a bleeder is less important in the second branch (with the switch at the top), as the nodes in this branch are faster. Indeed, in the second branch the Vgs of the current source (M2) is always present, and so are the charges in the channel of that transistor, both in on and off state. This is not the case in the first branch (and the cascode) where the channel charge disappears when the unit is turned off (without the bleeder). As building up charge is a relatively slow process, keeping the transistors M1 and M3 on (even during the off state of the unit) speeds up the cell. Note that this obviously results in a small DC power consumption. Similarly, a bleeder current source can be provided at the source terminal of M1 in the implementations of FIG. 7 and FIG. 8. Additionally, in FIG. 8 a bleeder current source can be added at the source terminal of M2 to keep a bleeder current flowing through M2 even when the unit cell is off. Note that in this case an additional current source is needed in parallel to SW2 to provide the current to M2 when the switch SW2 is closed.

While the disclosure has been illustrated and described in detail in the drawings and foregoing description, such illustration and description are to be considered illustrative or exemplary and not restrictive. The foregoing description details certain embodiments of the disclosure. It will be appreciated, however, that no matter how detailed the foregoing appears in text, the disclosure may be practiced in many ways. The disclosure is not limited to the disclosed embodiments.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. A conversion circuit, comprising:
   a first input terminal for receiving a digital signal;
   a second input terminal for receiving a bias voltage signal;
   an output terminal for outputting a current;
   a first and a second switch transistor connected to the first input terminal for receiving said digital signal;
   a first and a second current source transistor connected to the second input terminal for receiving the bias voltage signal;
   a first branch, wherein the first switch transistor is connected to the output terminal via the first current source transistor; and
   a second branch wherein the second current source transistor is connected to the output terminal via the second switch transistor.

2. The conversion circuit of claim 1, further comprising a transistor in cascade arranged for being fed with the current output via the output terminal.

3. The conversion circuit of claim 1, wherein the output terminal comprises:
   a first output terminal in the first branch; and
   a second output terminal in the second branch.

4. The conversion circuit of claim 1, wherein the digital signal is a modulated local oscillator signal.

5. The conversion circuit of claim 1, further arranged for adding a bleeder current.

6. A device comprising a conversion circuit as in claim 1.

7. A device comprising a plurality of conversion circuits as in claim 1, the conversion circuits being arranged in parallel.

8. The device of claim 6, further comprising a bias circuit arranged for generating the bias voltage signal, the bias circuit comprising a decoupling capacitance at its an output of the bias circuit.

9. The device of claim 7, wherein the digital signal is a phase modulated RF signal so that the device can act as a polar digital transmitter.

10. A system comprising a first and a second device as in claim 7, adapted for modulating an in-phase and a quadrature signal, respectively, so that the device can act as a Cartesian RF digital-to-analog converter.

11. A conversion circuit, comprising:
a first input terminal for receiving a digital signal;
a second input terminal for receiving a bias voltage signal;
an output terminal for outputting a current;
a first and a second switch transistor connected to the first input terminal for receiving said digital signal;
a first and a second current source transistor connected to the second input terminal for receiving the bias voltage signal, wherein the gate-source capacitance of the first current source transistor is substantially equal to the gate-drain capacitance of the second current source transistor;
a first branch, wherein the first switch transistor is connected to the output terminal via the first current source transistor; and
a second branch wherein second current source transistor is connected to the output terminal via the second switch transistor.

12. The conversion circuit of claim 11, wherein the ratio of the size of the first current source transistor to the size of the second current source transistor is about 1 to 3.

13. The conversion circuit of claim 11, further comprising a transistor in cascode arranged for being fed with the current output via the output terminal.

14. The conversion circuit of claim 11, wherein the output terminal comprises:
a first output terminal in the first branch; and
a second output terminal in the second branch.

15. The conversion circuit of claim 11, wherein the digital signal is a modulated local oscillator signal.

16. The conversion circuit of claim 11, further arranged for adding a bleeder current.

17. A device comprising a conversion circuit as in claim 11.

18. A device comprising a plurality of conversion circuits as in claim 11, the conversion circuits being arranged in parallel.

19. The device of claim 17, further comprising a bias circuit arranged for generating the bias voltage signal, the bias circuit comprising a decoupling capacitance at an output of the bias circuit.

* * * * *